United States Patent
Luo

(10) Patent No.: US 7,375,658 B2
(45) Date of Patent: May 20, 2008

(54) METHOD AND APPARATUS FOR DATA ENCODING

(75) Inventor: Zhong Hai Luo, Toronto (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 11/766,917

(22) Filed: Jun. 22, 2007

(65) Prior Publication Data

US 2007/0241948 A1    Oct. 18, 2007

Related U.S. Application Data

(63) Continuation of application No. 11/064,823, filed on Feb. 25, 2005, now Pat. No. 7,245,238.

(51) Int. Cl.
*H03M 7/00* (2006.01)
(52) U.S. Cl. .................................. 341/51; 341/50
(58) Field of Classification Search ............. 341/50–70
See application file for complete search history.

(56) References Cited

U.S. PATENT DOCUMENTS

| 6,285,300 | B1 | 9/2001 | Colon-Bonet |
| 6,492,918 | B1 | 12/2002 | Rezzi et al. |
| 6,542,093 | B2 | 4/2003 | Colon-Bonet |
| 7,194,537 | B2* | 3/2007 | Motoyama et al. ......... 709/224 |
| 7,209,952 | B2* | 4/2007 | Fong et al. ................ 709/206 |

OTHER PUBLICATIONS

S. Josefsson, Ed.: "The Base16, Base32, and Base64 Data Encodings" Internet Article, RFC 3548 [Online] Jul. 2003, XP002338496 Retrieved from the Internet: URL:http://www.rfc-editor.org/rfc/rfc3548.txt> [retrieved on Jul. 28, 2005] *p. 3, line 17-line24* *table1*.

Mikael Grev: "Based64.java" BASE64_2.2.ZIP, [Online] Aug. 7, 2004, XP002338497 Retrieved from the Internet: URL:http://migbase64.sourceforge.net/> [retrieved on Jul. 28, 2005] *p.3, line 14-line 19*.

* cited by examiner

*Primary Examiner*—Lam T. Mai
(74) *Attorney, Agent, or Firm*—Kent Daniels; Ogilvy Renault LLP

(57) ABSTRACT

A method and apparatus for data encoding such as 3 to 4 encoding (base64, uuencode etc.) is provided. Bytes of data to be encoded having negative values are made positive while preserving the information to be encoded. The positive values may be manipulated by addition (e.g. to a common store) and bit shifting to efficiently obtain encoded data such as by indexing an encoding alphabet.

8 Claims, 3 Drawing Sheets

METHOD AND APPARATUS FOR DATA ENCODING

CROSS-REFERENCE TO RELATED APPLICATION

This application is a continuation of U.S. patent application Ser. No. 11/064,823, filed Feb. 25, 2005 now U.S. Pat. No. 7,245,238.

COPYRIGHT NOTICE

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyright rights whatsoever.

FIELD OF THE INVENTION

The present invention relates generally to data processing and, more particularly, to methods and apparatus for encoding data.

DESCRIPTION OF THE RELATED ART

Electronic computing devices, whether mobile or not, are increasingly prevalent in modern society. Such devices may be adapted to communicate over wired or wireless communication networks. One common application of these devices is an electronic mail (email) application for communicating data in accordance with common standards. Such standards like RFC 2045, Multipurpose Internet Mail Extensions (MIME) Part One: Format of Internet Message Bodies, describe how Internet messages may be defined. (RFC 2045, Internet Engineering Task Force network Working Group, November 1996, http://www.ietf.org/rfc/rfc2045.txt).

Electronic mail is usually intended for a human user and thus includes data representative of text to be displayed or printed. However, non-textual data such as may be used to represent images, audio etc. may also be desired to be sent. One part of the Internet message standards provides for the communication of non-textual data as encoded textual data that is printable. This data is typically printable in accordance with 7-bit US-ASCII character standards. While different encoding schemes may be used to generate the printable characters from non-printable input, popular schemes include pure hexadecimal, uuencode, a 3-in-4 base 64 (base64) scheme, the Andrew Toolkit Representation (ATK), and others. Persons of ordinary skill in the art will appreciate that other scenarios exist or will provide suitable opportunities for data encoding. E.g. encoding a security certificate or message digest for easy transmission.

The base64 encoding scheme, as set forth in RFC 2045, defines a set of rules to use 64 characters ("A"-"Z", "a"-"z", "0"-"9", "+", "/" and "=" for padding, i.e. the base64 alphabet) to represent binary data which may include values which do not represent printable text characters. As noted in FIG. 1, base64 encodes three bytes (24 bits) of data input as four bytes of output data with each byte of output comprising a 6-bit character from the base64 alphabet. The alphabet chosen ensures compliance with the 7-bit requirements of US-ASCII text-based email standards.

Existing base64 implementations are available. Some Java™-based implementations, like that available from Sun Microsystems Inc. as part of its sun.* packages are not guaranteed to be portable (i.e. run in another vender's Java platform). As it is desired that supporting code such as a base64 encoder be particularly efficient and some implementations do not efficiently handle the manipulation of bits to be encoded there is a resulting need for a method and apparatus that addresses one or more of these shortcomings.

SUMMARY

The present invention relates to a method and apparatus for data encoding such as 3 to 4 encoding (base64, uuencode etc.). Bytes of data to be encoded having negative values are made positive while preserving the information to be encoded. The positive values may be manipulated by addition (e.g. to a common store; and bit shifting to efficiently obtain encoded data such as by indexing an encoding alphabet.

In accordance with an embodiment, there is a method for encoding data comprising obtaining a portion of data to be encoded, the portion comprising ordered bytes of signed data; for each byte of signed data having a negative value, converting the negative value to an equivalent positive value; adding a positive value or the equivalent positive value of each byte of signed data to a respective portion of a common store of signed data in accordance with the order of the bytes in said portion of data; and obtaining an encoded representation of the portion of data using said common store of signed data.

Persons of ordinary skill in the art will recognize apparatus, further method, computer program product and other aspects of the invention from the embodiments shown and described.

BRIEF DESCRIPTION OF THE DRAWINGS

Embodiments of the present invention will now be described by way of example with reference to attached figures, wherein.

DETAILED DESCRIPTION

Figure 1:
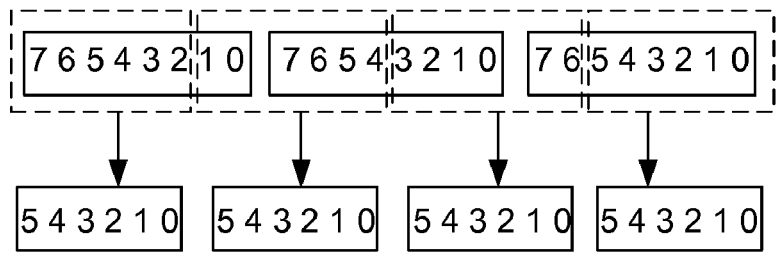
FIG. 1 illustrates a 3 to 4 encoding.
Figure 2:
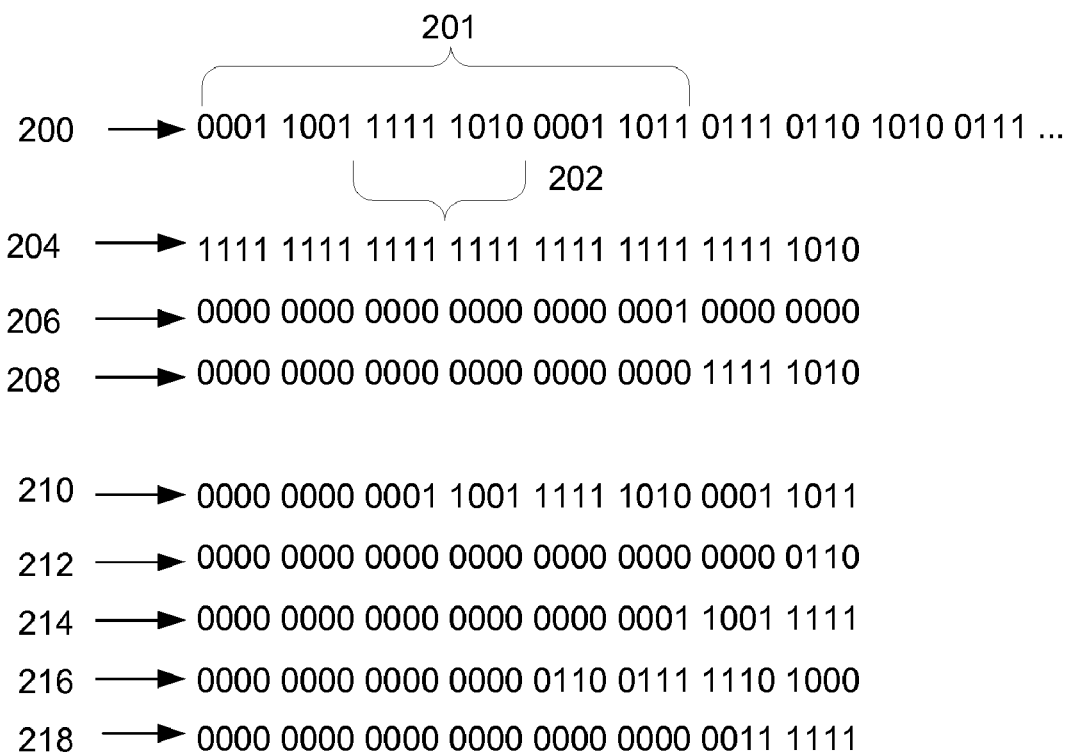
FIG. 2 illustrates an example of binary data to be encoded and representations of portions of the data to be encoded during encoding operations in accordance with an embodiment of the invention.

FIG. 2 illustrates a portion of a stream of data 200 to be encoded in accordance with the base64 encoding scheme. Other schemes such as uuencode well-known to persons of ordinary skill in the art may also be used with consequent adapting. Stream 200 includes a 3 byte portion 201 (i.e. 24 bits) for encoding as 4 bytes of encoded data (not shown). The order of the bytes of data is respected by the base64 scheme to ensure the proper combination of the 24 bits to determine the values of the 4-bytes of encoded data. Successive 6-bit portions of the 24 bits are determined and used to obtain a character from the base64 encoding alphabet as shown in FIG. 1.

In implementing an effective and efficient base64 encoder (whether as a software component or hardware/software apparatus) an important issue to resolve is how to combine the 24 bits from the 3 bytes to obtain the four 6-bit groups.

In common operating and software environments such as Java, data types such as a byte (8 bits of data) and an integer (4 bytes or 32 bits or data) are signed for storing positive and negative values in accordance with the two's complement standard. When the high order bit is 1, the value is treated as negative. Also, byte data types may be automatically converted to integer data types when certain operations (e.g. arithmetic operations) are performed. Conversion may introduce additionally set bits to account for two's complement representation in the high order bits of the integer data type.

The middle byte 202 of portion 201 illustrates a negative number having a decimal value of −6. When expanded from a byte to an integer (204) data type the high order bits are all set to define −6. However, only the lower order 8 bits are desired as they properly represent the original bits of byte 202. Ignoring the higher order bits and considering the value as a positive integer, these bits represent the decimal value 250, a difference of 256 (i.e. $2^8$.) which is the total number of different values that a byte may represent. Integer 204 may be converted to an equivalent positive value which represents the same bits of the desired byte by simply adding the value 256. Such is illustrated with reference to FIG. 2 where integer 206 has the value 256 and integer 208 is the result of the addition of integers 204 and 206.

The individual bytes of portion 201 may thus be collected into a common store 210 having a data type (e.g. integer) sufficient to represent all of the bits of the 3 bytes. This data type is preferably a primitive type that supports bitwise manipulation. Each byte may be converted to a data store having a like data type and an equivalent positive value. Where necessary, 256 may be added if an original value of a byte is negative. The positive value (whether original or converted by adding 256) can be collected such as by adding the value of the data store to the common store's appropriate bits. The data store may be left bit shifted to orient the bits to the appropriate bits of the common store in accordance with the order of the 3-bytes to be encoded. Integer 210 of FIG. 2 illustrates a common store holding the value of the 3-byte portion 201.

To obtain the 4 bytes of encoded data, the bits of common store (e.g. 210) may be manipulated such as by bit shifting and masking (as may be necessary) to select 4 respective portions of 6 bits each of the common store. The value of each respective portion thereof may be used (e.g. as an index, pointer, offset or the like) to obtain the encoded byte data such as a character of the base64 encoding alphabet. Integers 212-216 illustrate integer 210 right shifted 18, 12 and 6 bits each for defining 3 respective portions of the common store. Integer 210 itself can be bit shifted 0 bits for use as the fourth portion. A mask such as integer 218 with its 6 low order bits set (0x3f) may be used to isolate the desired bits in a well-known fashion.

Figure 3A:
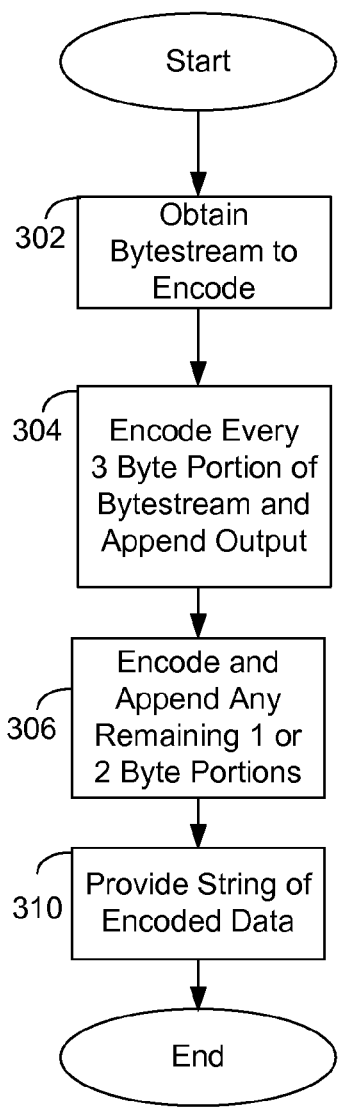
FIGS. 3A and 3B are flow charts of operations for encoding data in accordance with an embodiment of the invention.
Figure 3B:
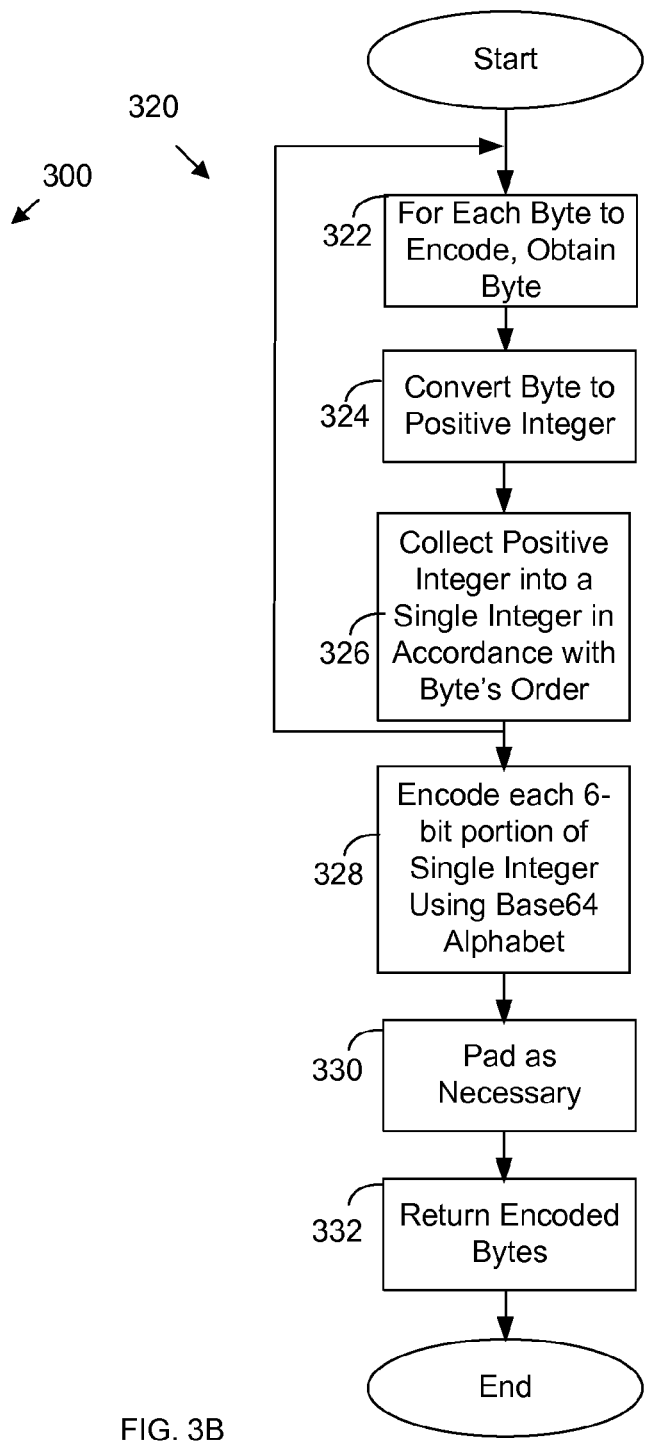

FIGS. 3A and 3B illustrate flow charts of operations 300 and 320, in accordance with an embodiment of the invention, for a base64 encoding implementation. Operations 300 illustrate steps to encode successive portions of a bytestream to be encoded and operations 320 steps to encode individual portions.

At step 302, a bytestream to encode is obtained. At 304, successive 3-byte portions are obtained, one at a time and operations 320 invoked to encode each portion. The encoded results (i.e. 4 bytes of encoded data) are appended to define an output. At step 306, in accordance with the base64 scheme, any remaining one or 2 byte portion of the bytestream is encoded and appended such as by invoking operations 320. Operations 320 may be invoked passing a count of the number of bytes (e.g. 3, 2 or 1) of data to encode to assist with padding, if necessary. At step 310 the resulting encoding of the bytestream, now roughly 33% larger, is provided. The encoded data may be provided as a string data type.

Operations 320 commence when invoked, receiving ordered bytes of the bytestream data to be encoded and a count (e.g. 3, 2 or 1) of the number of bytes to encode. At step 322, a specific byte to be encoded is obtained in accordance with the order. At step 324 the value of the byte is converted to an integer data type having a positive value equivalent to the original bits of the byte. This may be achieved by storing the value of the byte to a data store having an integer data type and, as necessary, adding 256 if the byte's value is originally negative.

At 326, the bytes to be encoded are collected (e.g. one at a time) by adding the value of the data store to a common store of type integer respecting the original order of the bytes to be encoded. The bits of the data store may be left bit shifted 16, 8 or 0 bits to move the value of the data store into an appropriate position for adding to the common store. The data store need not be masked when adding to the common store.

Operation s 322 to 326 may be performed sequentially per byte to be encoded. Thus operations my loop at step 326 to 322 until all bytes are collected. Below is a pseudo-code extract representing an embodiment of operations 322-326:

```
int collection = 0;
for (int i = 0; i < blocksize; i++) {
    byte tempByte = byteStream[i];
    int tempInt = (tempByte < 0) ? tempByte + 256 : tempByte;
    collection += tempInt << (8 * (2 - i));
}
```

In the pseudo-code, the data store tempInt of type integer is used to convert each byte of data to be encoded. Data store tempInt is respectively left bit shifted in accordance with the order of the byte to move the bits into position for common store collection.

Alternatively, rather than add 256 to obtain the equivalent positive value, data store tempInt may receive the value of the byte to be encoded (e.g. byteStream[i]) and be bit masked to select only the original bit information of the byte. The following pseudo code is illustrative:

```
int collecton = 0;
for (int i = 0; i < blockSize; i++) {
    int tempInt = byteStream[i] & 0x00FF;
    collection += tempInt << (8 * (2 - i));
}
```

At step 328, four respective portions of common store are used to encode bytes of encoded data. 6-bit groups are obtained and used to index an encoding alphabet for base64 to select the desired character indicated by the value of the bits. Below is a pseudo-code extract representing an embodiment of step 328:

```
int mappingIndex = 0;
for (int i = 0; i < 4; i++) {
    mappingIndex = (collection >>> (6 * (3 - i))) & 0x3f;
    base64Block[i] = getMappingChar(mappingIndex);
}
```

As necessary, for example, in response to the count of the bytes to be encoded, 0, 1 or 2 bytes of the encoded data are padded with a padding character from the encoding alphabet at step 330. At step 332 the encoded bytes are returned in response to the invocation.

Persons of ordinary skill in the art will appreciate that the methods described herein may be implemented in software for execution by apparatus such as a computer, appliance, mobile device, PDA, etc. having a processor and memory coupled thereto for storing instructions for execution by the processor.

Figure 4:
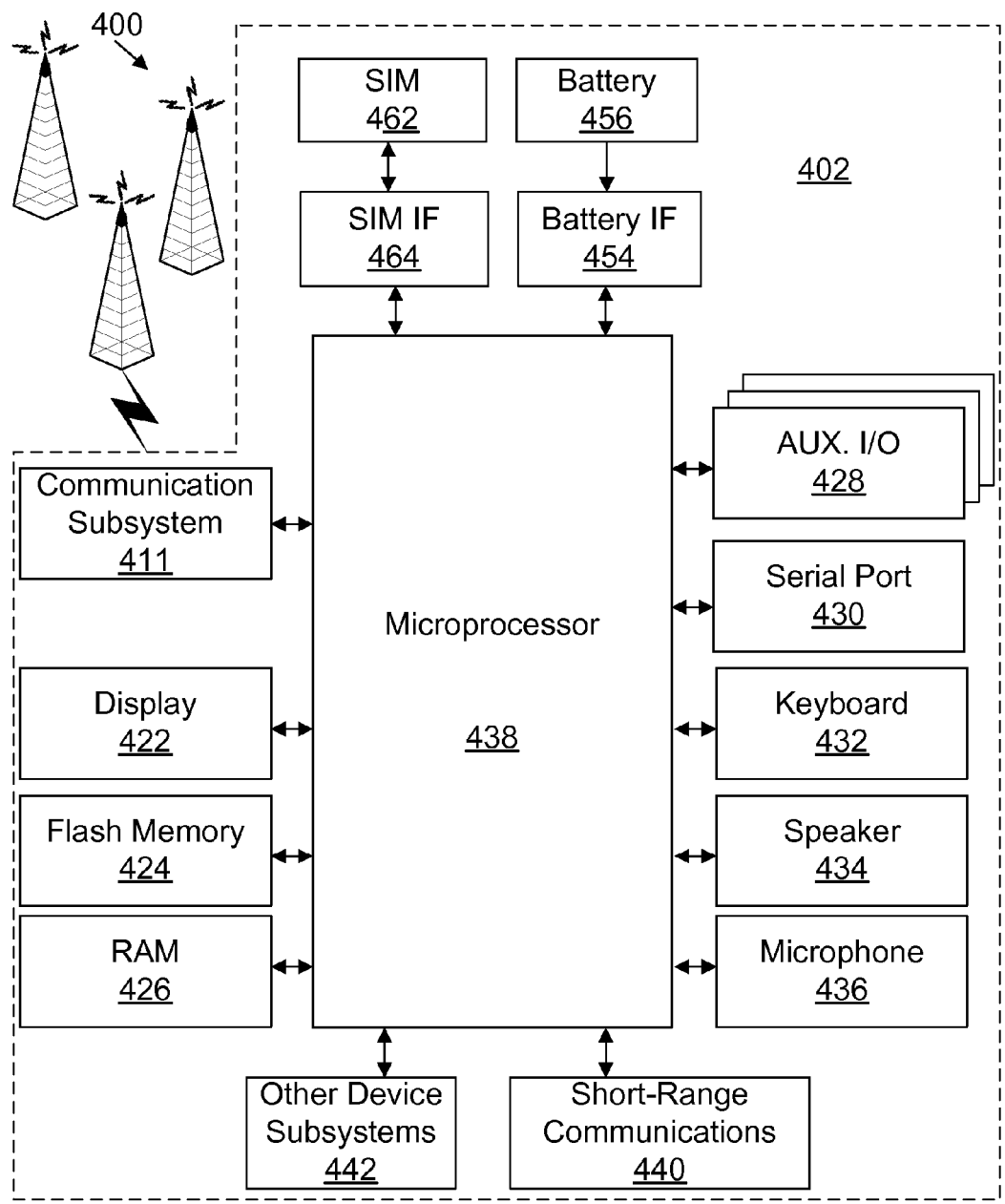
FIG. 4 is an illustration of a mobile device adaptable in accordance with an embodiment of the invention for encoding data.

FIG. 4 is a detailed block diagram of a preferred mobile device 402 which is adaptable in accordance with an embodiment of the invention for encoding data. Mobile device 402 is preferably a two-way communication device having voice and advanced data communication capabilities, including the capability to communicate with other computer systems. Depending on the functionality provided by mobile device 402, it may be referred to as a data messaging device, a two-way pager, a cellular telephone with data messaging capabilities, a wireless Internet appliance, or a data communication device (with or without telephony capabilities). Mobile device 402 may communicate with any one of a plurality of base station transceiver systems 400 within its geographic coverage area.

Mobile electronic device 402 will normally incorporate a communication subsystem 411, which includes a receiver, a transmitter, and associated components, such as one or more (preferably embedded or internal) antenna elements and, local oscillators (LOs), and a processing module such as a digital signal processor (DSP) (all not shown). As will be apparent to those skilled in field of communications, particular design of communication subsystem 411 depends on the communication network in which mobile electronic device 402 is intended to operate.

Network access is associated with a subscriber or user of mobile electronic device 402 and therefore mobile electronic device 402 requires a Subscriber Identity Module or "SIM" card 462 to be inserted in a SIM IF 464 in order to operate in the network. Mobile electronic device 402 is a battery-powered device so it also includes a battery IF 454 for receiving one or more rechargeable batteries 456. Such a battery 456 provides electrical power to most if not all electrical circuitry in mobile electronic device 402, and battery IF 454 provides for a mechanical and electrical connection for it. The battery IF 454 is coupled to a regulator (not shown) which provides power V+ to all of the circuitry.

Mobile electronic device 402 includes a controller such as a microprocessor 438 which controls overall operation of mobile electronic device 402. Communication functions, including at least data and voice communications, are performed through communication subsystem 411. Microprocessor 438 also interacts with additional device subsystems such as a display 422, a flash memory 424, a random access memory (RAM) 426, auxiliary input/output (I/O) subsystems 428, a serial port 430, a keyboard 432, a speaker 434, a microphone 436, a short-range communications subsystem 440, and any other device subsystems generally designated at 443. Some of the subsystems shown in FIG. 4 perform communication-related functions, whereas other subsystems may provide "resident" or on-device functions. Notably, some subsystems, such as keyboard 432 and display 422, for example, may be used for both communication-related functions, such as entering a text message for transmission over a communication network, and device-resident functions such as a calculator or task list. Operating system software used by microprocessor 438 is preferably stored in a persistent store such as flash memory 424, which may alternatively be a read-only memory (ROM) or similar storage element (not shown). Those skilled in the art will appreciate that the operating system, specific device applications, or parts thereof, may be temporarily loaded into a volatile store such as RAM 426.

Microprocessor 438, in addition to its operating system functions, preferably enables execution of software applications on mobile electronic device 402. A predetermined set of applications which control basic device operations, including at least data and voice communication applications, will normally be installed on mobile electronic device 402 during its manufacture. A preferred application that may be loaded onto mobile electronic device 402 may be a personal information manager (PIM) application having the ability to organize and manage data items relating to the user such as, but not limited to, instant messaging (IM), e-mail, calendar events, voice mails, appointments, and task items. The PIM application would be capable of being stored in a persistent store such as flash memory 424, ROM or similar storage element, or in a volatile store such as RAM426. Statements and instructions corresponding to the methods of the invention, such as operations 300 and 320 may be stored for execution by microprocessor 438 as a portion of the PIM application or for use thereby. Naturally, one or more memory stores are available on mobile electronic device 402 and SIM 462 to facilitate storage of PIM data items and other information.

The PIM application preferably has the ability to send and receive data items via the wireless network. In a preferred embodiment, PIM data items are seamlessly integrated, synchronized, and updated via the wireless network, with the mobile electronic device user's corresponding data items stored and/or associated with a host computer system thereby creating a mirrored host computer on mobile electronic device 402 with respect to such items. This is especially advantageous where the host computer system is the mobile electronic device user's office computer system. Additional applications may also be loaded onto mobile electronic device 402 through network 400, an auxiliary I/O subsystem 428, serial port 430, short-range communications subsystem 440, or any other suitable subsystem 442, and installed by a user in RAM 426 or preferably a non-volatile store (not shown) for execution by microprocessor 438. Such flexibility in application installation increases the functionality of mobile electronic device 402 and may provide enhanced on-device functions, communication-related functions, or both. For example, secure communication applications may enable electronic commerce functions and other transactions to be performed using mobile electronic device 402.

In a data communication mode, a received signal such as a text message, an e-mail message, or web page download will be processed by communication subsystem 411 and input to microprocessor 438. Microprocessor 438 will preferably further process the signal for output to display 422, to auxiliary I/O device 428 or both. A user of mobile electronic device 402 may also compose data items, such as e-mail messages, for example, using keyboard 432 in conjunction with display 422 and possibly auxiliary I/O device 428. Keyboard 432 is preferably a telephone type keypad, full alphanumeric keyboard or full or condensed QWERTY keypad. These composed items may be transmitted over a communication network through communication subsystem 411.

For voice communications, the overall operation of mobile electronic device 402 is substantially similar, except that the received signals would be output to speaker 434 and signals for transmission would be generated by microphone 436. Alternative voice or audio I/O subsystems, such as a voice message recording subsystem, may also be implemented on mobile electronic device 402. Although voice or audio signal output is preferably accomplished primarily through speaker 434, display 422 may also be used to provide an indication of the identity of a calling party, duration of a voice call, or other voice call related information, as some examples.

Serial port 430 in FIG. 4 is normally implemented in a personal digital assistant (PDA)-type communication device for which synchronization with a user's desktop computer is a desirable, albeit optional, component. Serial port 430 enables a user to set preferences through an external device or software application and extends the capabilities of mobile electronic device 402 by providing for information or software downloads to mobile electronic device 402 other than through a wireless communication network. The alternate download path may, for example, be used to load an encryption key onto mobile electronic device 402 through a direct and thus reliable and trusted connection to thereby provide secure device communication.

Short-range communications subsystem 440 of FIG. 4 is an additional optional component which provides for communication between mobile electronic device 402 and different systems or devices, which need not necessarily be similar devices. For example, subsystem 240 may include an infrared device and associated circuits and components, or a Bluetooth™ communication module to provide for communication with similarly-enabled systems and devices. Bluetooth™ is a registered trademark of Bluetooth SIG, Inc.

In accordance with an embodiment of the invention, mobile device 402 is a multi-tasking wireless communications device configured for sending and receiving data such as electronic mail, instant messages, SMS messages, and other data messages and for making and receiving voice calls. To provide a user-friendly environment to control the operation of mobile device 402, an operating system (not shown) resident on device 402 provides a user interface such as a graphical user interface (GUI) having a main screen and a plurality of sub-screens navigable from the main screen.

The above-described embodiments of the present application are intended to be examples only. Those of skill in the art may effect alterations, modifications and variations to the particular embodiments without departing from the scope of the application. The invention described herein in the recited claims intends to cover and embrace all suitable changes in technology.

The invention claimed is:

1. A method for encoding data in a data communication device, the method comprising steps of:
    obtaining a portion of data to be encoded, the portion being three bytes in length and comprising at least one byte of signed data in two's complement representation;
    converting each byte of signed data to a respective data store;
    for each byte of signed data having a negative value, adding 256 to the respective data store;
    collecting each data store into a respective portion of a common store in accordance with an order of the respective byte in the portion of data, the common store being four bytes in length;
    encoding successive 6-bit portions of the common store using a Base64 alphabet to obtain encoded byte data; and
    transmitting the encoded byte data over a communications network to another data communication device.

2. The method of claim 1, wherein a data type of each data store is the same as that of the common store.

3. The method of claim 1, wherein the data type is an 'integer' data type.

4. The method of claim 1, wherein the step of collecting each data store into a respective portion of the common store comprises, for each data store:
    calculating a starting bit position based on the order of the respective byte in the portion of data; and
    adding the data store into the common store beginning at the calculated starting bit position.

5. The method of claim 1, wherein the step of encoding each successive 6-bit portion of the common store comprises steps of:
    extracting each successive 6-bit portion from the common store; and
    mapping the extracted 6-bit portion to a corresponding character of the Base64 alphabet.

6. The method of claim 5, wherein the step of extracting each successive 6-bit portion from the common store comprises steps of:
    bit shifting the common store; and
    bit masking the bit-shifted common store.

7. The method of claim 1, further comprising a step of padding the encoded byte data.

8. The method of claim 7, wherein the step of padding the encoded byte data comprises steps of:
    determining a number of bytes of signed data within the portion to be encoded;
    determining a required number of padding characters, the required number being a difference between the length of the portion, in bytes, and the number of bytes (202) of signed data to be encoded; and
    inserting the required number of a predetermined padding character of the Base64 alphabet into the encoded byte data.

* * * * *